US011831344B2

(12) United States Patent
Malach et al.

(10) Patent No.: US 11,831,344 B2
(45) Date of Patent: Nov. 28, 2023

(54) PROVIDING CODEWORDS

(71) Applicant: DSP Group Ltd., Herzliya (IL)

(72) Inventors: Tomer Malach, Ramat Gan (IL); Moshe Haiut, Ramat Gan (IL)

(73) Assignee: DSP Group Ltd.

(*) Notice: Subject to any disclaimer, the term of this patent is extended or adjusted under 35 U.S.C. 154(b) by 934 days.

(21) Appl. No.: 16/747,567

(22) Filed: Jan. 21, 2020

(65) Prior Publication Data
US 2020/0234125 A1 Jul. 23, 2020

Related U.S. Application Data

(60) Provisional application No. 62/794,707, filed on Jan. 21, 2019.

(51) Int. Cl.
*H03M 7/42* (2006.01)

(52) U.S. Cl.
CPC .................. *H03M 7/425* (2013.01)

(58) Field of Classification Search
CPC .......... H03M 7/425; G06N 3/08; G06N 3/063
See application file for complete search history.

(56) References Cited

U.S. PATENT DOCUMENTS 10,133,739 B2 * 11/2018 Le .................. G06N 3/045
2017/0357635 A1 * 12/2017 Mohaideen P ....... G06F 16/243

* cited by examiner

*Primary Examiner* — Xiao En Mo
(74) *Attorney, Agent, or Firm* — Paradice & Li LLP

(57) ABSTRACT

A method for providing codewords, the method may include receiving by an input buffer, one or more chunks of data; calculating a location of relevant bits within one or more chunks of data; wherein the relevant bits comprise (a) variable length retrieval information used during a retrieval process of a first type codeword, or (b) a second type codeword; performing the retrieval process of the first type codeword and retrieving the first type codeword from a memory unit that stores only a fraction of a codebook, the codebook comprises first type codewords and second type codewords; determining whether the relevant bits comprises the second type codeword or not; and outputting the second type codeword or the first type codeword, based on the determination.

25 Claims, 8 Drawing Sheets

PROVIDING CODEWORDS

CROSS REFERENCE

This application claims priority from U.S. provisional patent 62/794,707 filing date 21 Jan. 2019.

BACKGROUND OF THE INVENTION

There is a growing need to provide codewords in a fast manner.

A codeword may be a weight of a neural network.

A neural network include multiple nodes (neurons) that are fed by input values that may be associated with different weights.

A neural network may be configured multiple times during the operation of a device that includes the neural network. The configuration of a neural network may involve feeding the weights to the neural network.

Large neural networks may require a vast number of weights. Storing the vast number of weights and the configuration process may require substantial computational and memory resources. For example—about 1 Mbyte may be required for storing a complex neural network.

The weights may be encoded (compressed)—but the decoding is very complex and requires a substantial hardware resources.

There is a growing need to provide an efficient manner to decode neural network weights in an efficient manner.

SUMMARY

There may be provided methods, device and computer readable media as illustrated in at least one of the specification and drawings.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
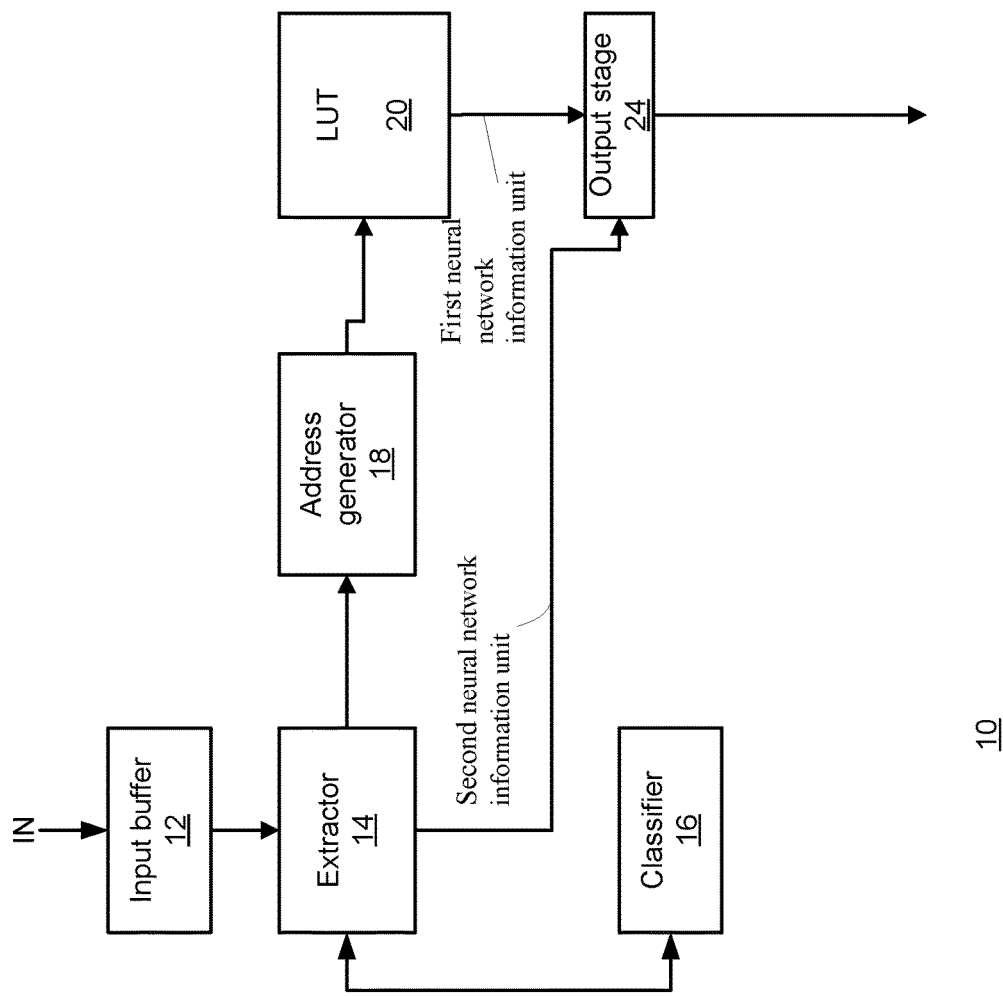
FIG. 1 illustrates a device according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

According to an embodiment of the invention there is provided a device and method for decoding weights of neural networks.

Any reference to a device should be applied, mutatis mutandis to a method that is executed by a device and/or to a non-transitory computer readable medium that stores instructions that once executed by the device will cause the device to execute the method.

Any reference to method should be applied, mutatis mutandis to a device that is configured to execute the method and/or to a non-transitory computer readable medium that stores instructions that once executed by the device will cause the device to execute the method.

Any reference to a non-transitory computer readable medium should be applied, mutatis mutandis to a method that is executed by a device and/or a device that is configured to execute the instructions stored in the non-transitory computer readable medium.

The term "and/or" is additionally or alternatively.

The phrases "configured" and "constructed and arranged" have the same meaning.

The number of bits illustrated in any part of the applications are non-limiting examples of sizes. The same is applicable to any size, length, width, clock rate, frequency or any other dimension or parameter illustrated in the application.

There may be provided a method, a device and a non-transitory computer readable medium for providing codewords.

The codewords may represent at least parts of neural network weights. A codeword may include at least a part of a weight of a neural network. A codeword may include other content. Neural network weights are an example of content of codewords. For simplicity of explanation some of the following text will refer to weights of a neural network.

Popular codewords or codewords that have a higher than other probability of being retrieved are stored in a compact memory unit. Only a part of the entire codebook is stored in the compact memory unit. For example—when the codewords represent weights of a neural network—the weights with the highest probability to be fetched may be stored in the compact memory unit.

The codewords are encoded using a variable length encoding—especially retrieval information for retrieving the codewords are variable length encoded.

Referring to the compact memory unit—compact may be between 1 Kb to 0.5 Mbyte—although any other sizes are available.

The compactness may be represented by the ratio between the memory size required to store all the codewords and the memory size of the compact memory unit.

The weights that are not stored in the compact memory table will be referred to as second weights. These are usually the less popular weights.

An encoded first weight includes retrieval information. The retrieval information is used to retrieve at least a portion of the first weight (non-encoded) from the compact memory unit.

Address information from the retrieval information may be further processed to generate the address of the first weight within the compact memory unit. The further processing may include size conversion, format change, and the like. For example—an encoded first weight may store 11 bits of address while the compact memory unit should be accessed with a 12-bit address.

The retrieval information may include a size indicator that represents the size of address information. The retrieval information may include a type indicator that indicates whether the weight is of the first type (encoded first weight) or the second type (second weight). It is noted that the same bits in the encoded first weight and/or in the second weight may be used for more than one purpose.

The encoded first weight may be smaller than the first weight.

A second weight may not be decoded but some of its bit may have a value that may serve as type indicator and/or size indicator.

A decoder may retrieve data chunks of size that may differ from the size of the second weight and/or from the size of the encoded first weight. Thus, the decoder may extract a second weight and/or an encoded first weight from one or more data chunks.

When the decoder determines that it is processing an encoded first weight—the output of the decoder is the second weight. When the decoder determines that it is processing a first weight—the output of the decoder is the first weight.

The decoding process of the first weight may be very simple and may include few steps—for example it may be substantially limited to extraction of the encoded first weight, calculating the address of the encoded first weight, retrieving the first weight from the (preferably single) compact memory unit and outputting the first weight. These mentioned above operations are simple, low-complexity and short operations. This may allow the decoder to output a weight at each clock cycle.

By storing only some of the weights in the compact memory unit—the overall resources allocated in a device for storage—are reduced.

FIG. 1 illustrates an example of a decoder 10.

The decoder 10 includes an input buffer 12 for receiving chunks of data.

Extractor 14 extracts relevant bits from the input buffer 12—for example it may extract and send the type indicator to classifier 16, may search for a size indicator in order to know how much bits to send (especially in case of a reception of an encoded first weight) to the address generator 18.

The classifier 16 may determine whether the input buffer stores an encoded first weight or stores a second weight—and send an indication of the class/type (encoded first or second) to the extractor and to an output stage 24. The values of the class indicator may determine the class.

If it is determined that the current processing cycle is related to an encoded first weight, the extractor (based on the size indicator) sends at least a part of the retrieval information to address generator 18 that in turn generates an address, and accesses LUT 20 to provide the first weight.

The output stage 24 determines whether to output a first weight or a second weight—based on the classification.

Figure 2:
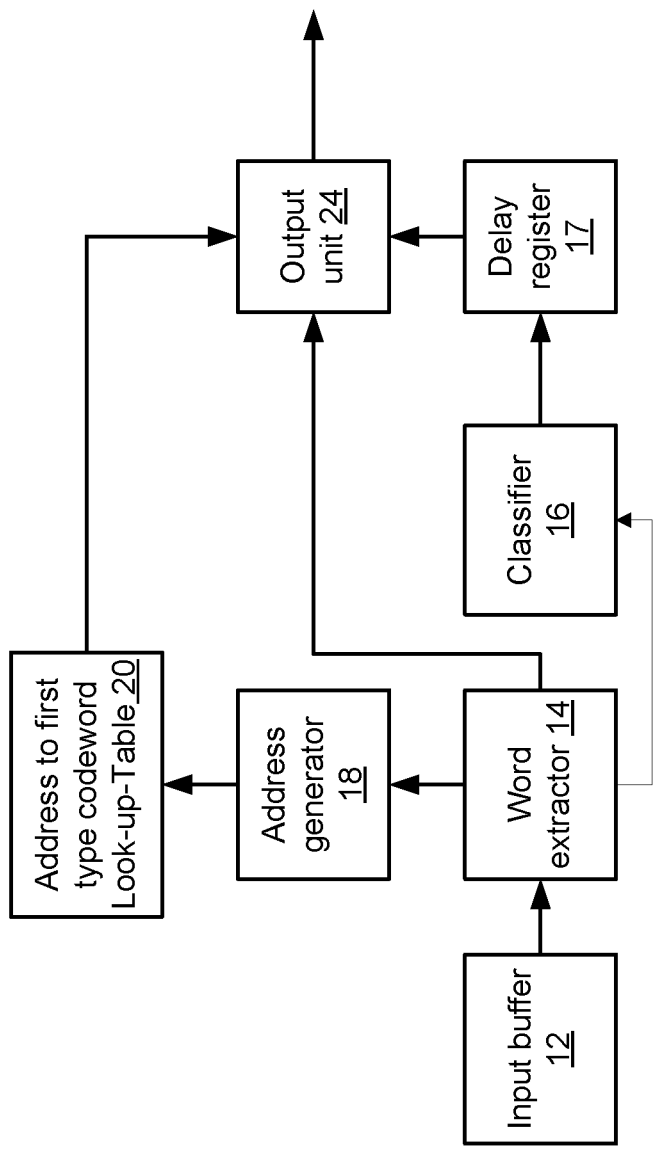
FIG. 2 illustrates a device according to an embodiment of the invention.

FIG. 2 illustrates a decoder 11 that includes the input buffer 12, the word extractor 14, the classifier 16, the output unit 24, the address generator 18, a LUT that is an address to first type codeword LUT 20 and also has a delay register 17 for delaying the selection between the output of LUT 20 and the output of the word extractor 14.

Figure 3:
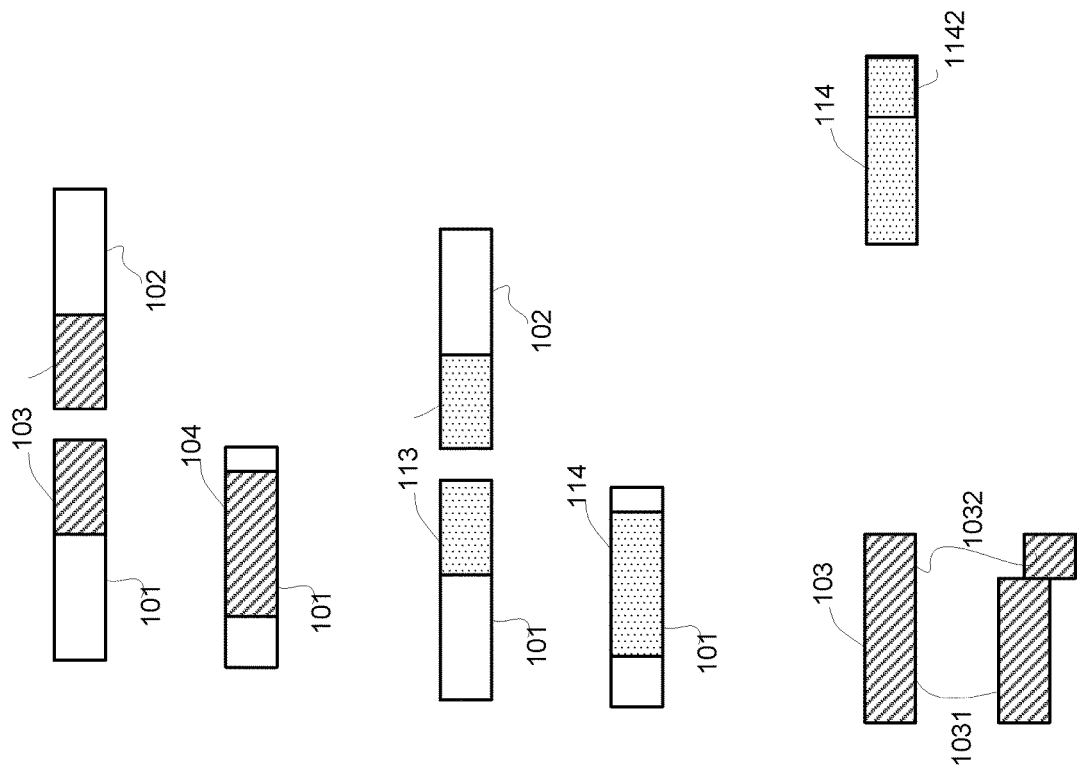
FIG. 3 illustrates a data structures according to an embodiment of the invention.

FIG. 3 illustrates various examples of differences between the size of data chunks 101 and 102 and between second weight 113, second weight 114, encoded first weight 103, and encoded first weight 104. A certain second weight and/or an encoded first weight may span along two data chunks and/or may span along a part of a data chunk.

FIG. 3 illustrates second weight 114 in which some of the bits (1142) are both a part of the second weight but are also used as a type indicator. The encoded first weight is shown as including a separate class indicator 1302 that is not part of the address (1301) of the encoded first weight.

Figure 4:
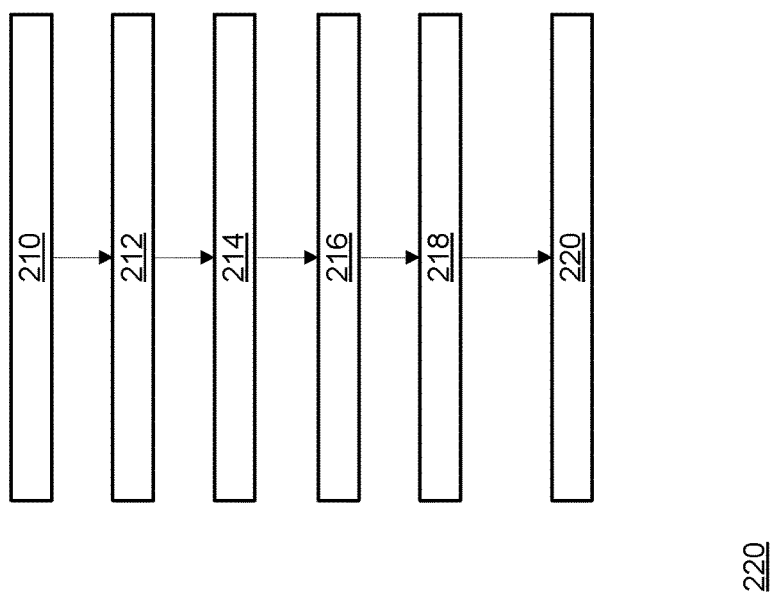
FIG. 4 illustrates a method according to an embodiment of the invention.

FIG. 4 illustrates method 200.

Method 200 may include the following steps:
a. Step 210 of receiving by an input buffer, one or more chunks of data. Preferably one chunk per cycle.
b. Step 212 of extracting relevant bits from the input buffer—for example extracting type indicator and/or extracting a size indicator.
c. Step 214 of determining, based on a class indicator, the class—whether the bits of interest are an encoded first weight or a second weight.
d. Step 216 of sending to an address generator at least a part of retrieval information (stored in the input buffer)—when it is determined that the bits of interest are an encoded first weight.
e. Step 218 of generating an address and accessing a compact memory unit such as a LUT to provide the first weight.
f. Step 220 of outputting, based on the class—the first weight or the second weight.

Figure 5:
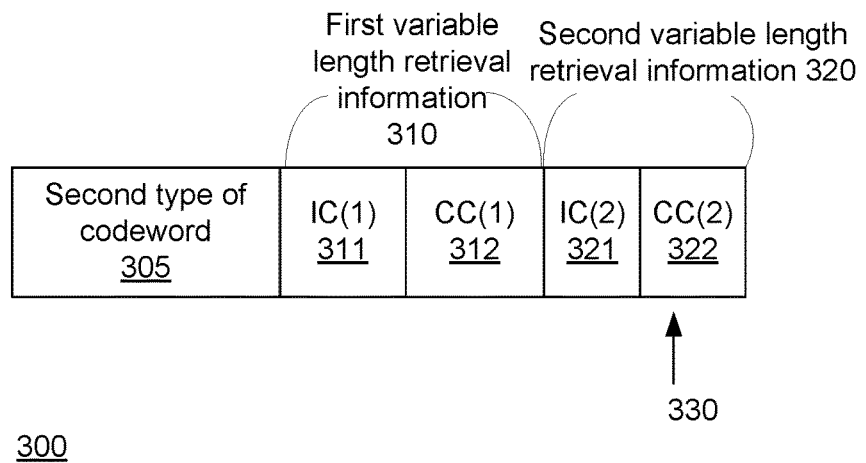
FIG. 5 illustrates a data structures according to an embodiment of the invention.

FIG. 5 illustrates a second type of codeword 305, a first variable length retrieval information 310 and a second variable length retrieval information 320.

First variable length retrieval information 310 includes a first classcode field CC(1) 312 and a first indexcode field IC(1) 311.

Second variable length retrieval information 320 includes a second classcode field CC(2) 322 and a second indexcode field IC(2) 321. These fields will be explained below.

Figure 6:
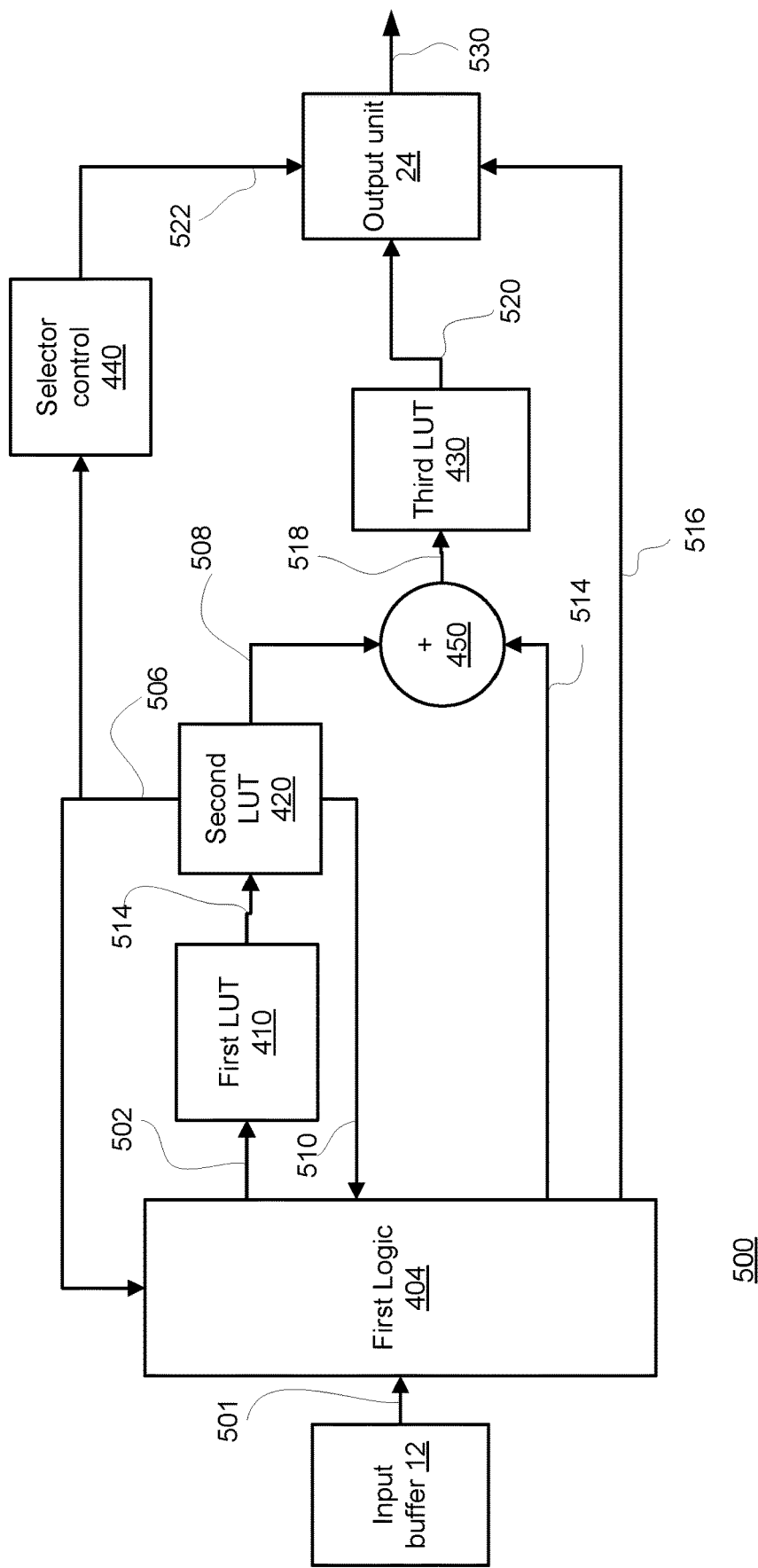
FIG. 6 illustrates a device according to an embodiment of the invention.

FIG. 6 illustrates system 500 that include input buffer 12, first logic 404, first LUT 410, second LUT 420, adder 450, third LUT 430, selector control 440 and output unit 24.

The input buffer 12 stores data chunks of a compressed data bit stream. The input buffer may be of any size. It is assumed that the input buffer is a 32-bit FIFO, where in each double-word (32-bit) that is read from the FIFO the least-significant bit comes first.

Implementing variable-length decoding with a single lookup table may result in a very big table to implement. Therefore the variable-length codes are separated into groups or classes, where each class is for a different code length. As an example, if the maximal code size is 20 bits long, then instead of a single table of 2^20=1 Mega entries the codes are divided into 8-bit classes, then the remaining is only 20–8=12 bits, which can be easily implemented with a smaller 2^12=4096 entries table.

The input bit stream is made of variable length codewords, where each codeword is between 1-24 bits long, and made of two variable length fields—classcode and indexcode.

Classcode determines the selected variable encoding (for example Huffman) class and is a variable length field of 1-8 bits.

The field indexcode determines the element index within the selected Huffman class and is a variable length field of 0-12 bits or 16 bits (16 bits in the case of plain codeword, where compression was not possible).

The couple (classcode, indexcode) determines a full codeword, and its length is 1-24 bits. Each codeword is used by the decoder to produce a 16-bit output plain data. FIG. 2-19 below illustrates the order and length of the classcode and the indexcode fields as parts of the codeword and bit-stream.

The calculation of an address of a codeword (within third LUT 430) is based on the first and second LUTs 410 and 420. All three LUTs may be programmable. The LUTs may be implemented in any manner—for example—the first and second LUTs may be asynchronous memories and the third LUT may be a synchronous memory.

The classcode may be up to 8 bits long. In order to identify the Classcode the 8 Lsbits of the codeword are retrieved and are fed (signal 502) to first LUT 410 to identify the Classcode and extract the parameter class_numb 514. Where there are sixteen classes—class_numb 514 is 4 bits long. Other lengths may be required for different numbers of classes.

Indexcode identification. Using class_numb 514—accessing second LUT 420 to extract three parameters that relate to the identified class: the classcode_length 510 (represented by 3 bits), class_address 508 (base address of the class within the third LUT 430) (represented by 12 bits) and the indexcode_length 506 (represented by 4 bits).

The first logic 404 receives classcode_length 510, skips (using the pointer and the information sent from the second LUT) the classcode and extract from the currently read codeword the Indexcode (using parameter indexcode_length).

If indexcode_length is less than a threshold (for example 13) then produce the 12-bit element_index 514—for example by extending the Indexcode to 12-bit with '0' bits if required. Else assume that Indexcode length is 16 and extract it as a codeword—see signal plain_codeword 516.

The adder 450 adds class_address 508 and element_index 514 to provide element address 518 used to access the third LUT 430.

The selector 440 receives indexcode_length 506, determines whether (whether indexcode_length 506 exceeds a threshold) the output unit 24 should output plain_codeword 516 or the output 520 from the third LUT 430 and send a control signal 522 for controlling the output unit 24.

Next Codeword follows immediately the current Codeword in the bit-stream.

Figure 7:
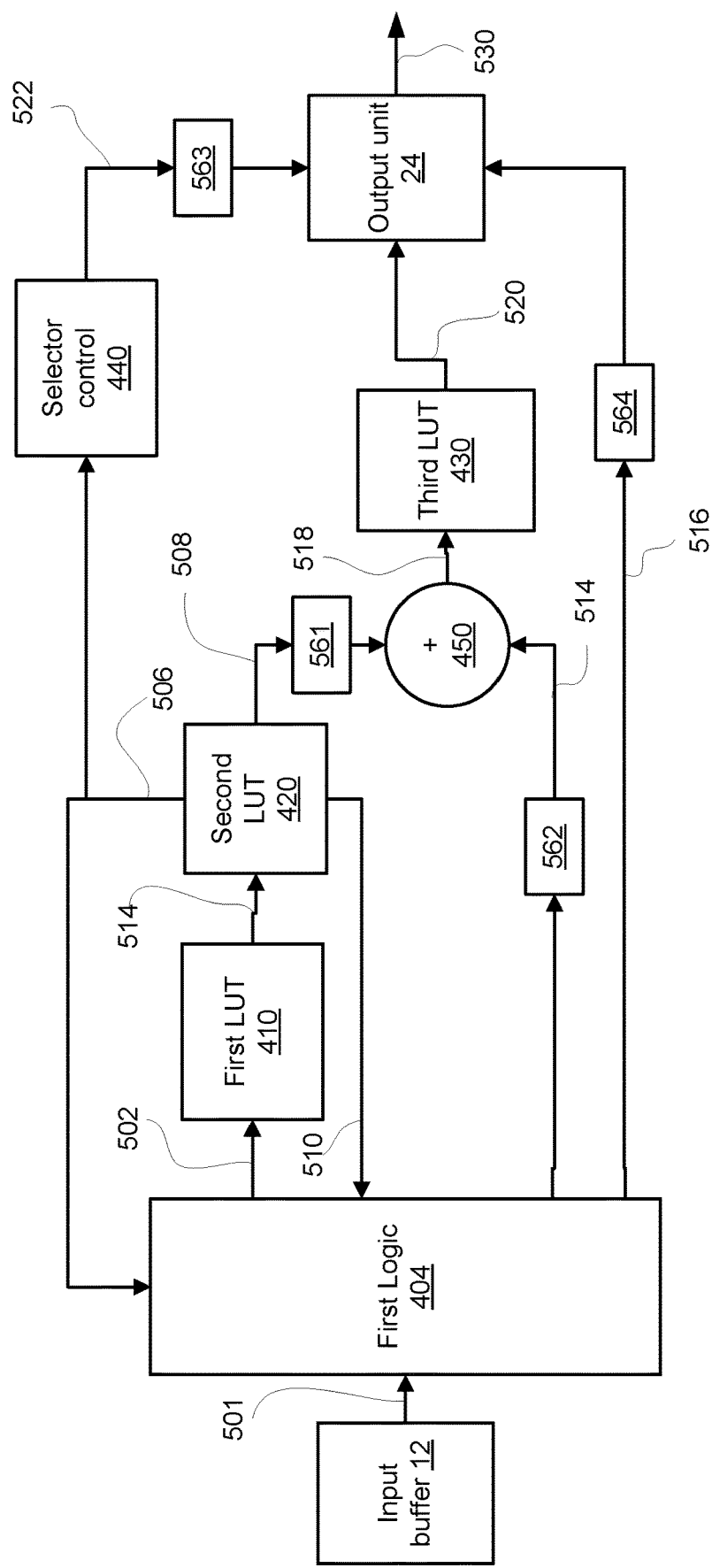
FIG. 7 illustrates a device according to an embodiment of the invention.

FIG. 7 illustrates a system 500'.

System 500' includes input buffer 12, first logic 404, first LUT 410, second LUT 420, adder 450, third LUT 430, selector control 440, output unit 24, first buffer 561, second buffer 562, third buffer 563 and fourth buffer 564 for storing class_address 508, element_index 514, control signal 522, and plain_codeword 516, respectively.

This allows the provision of the codewords within two-clocks.

Otherwise the codewords may be provided within a single clock cycle.

Figure 8:
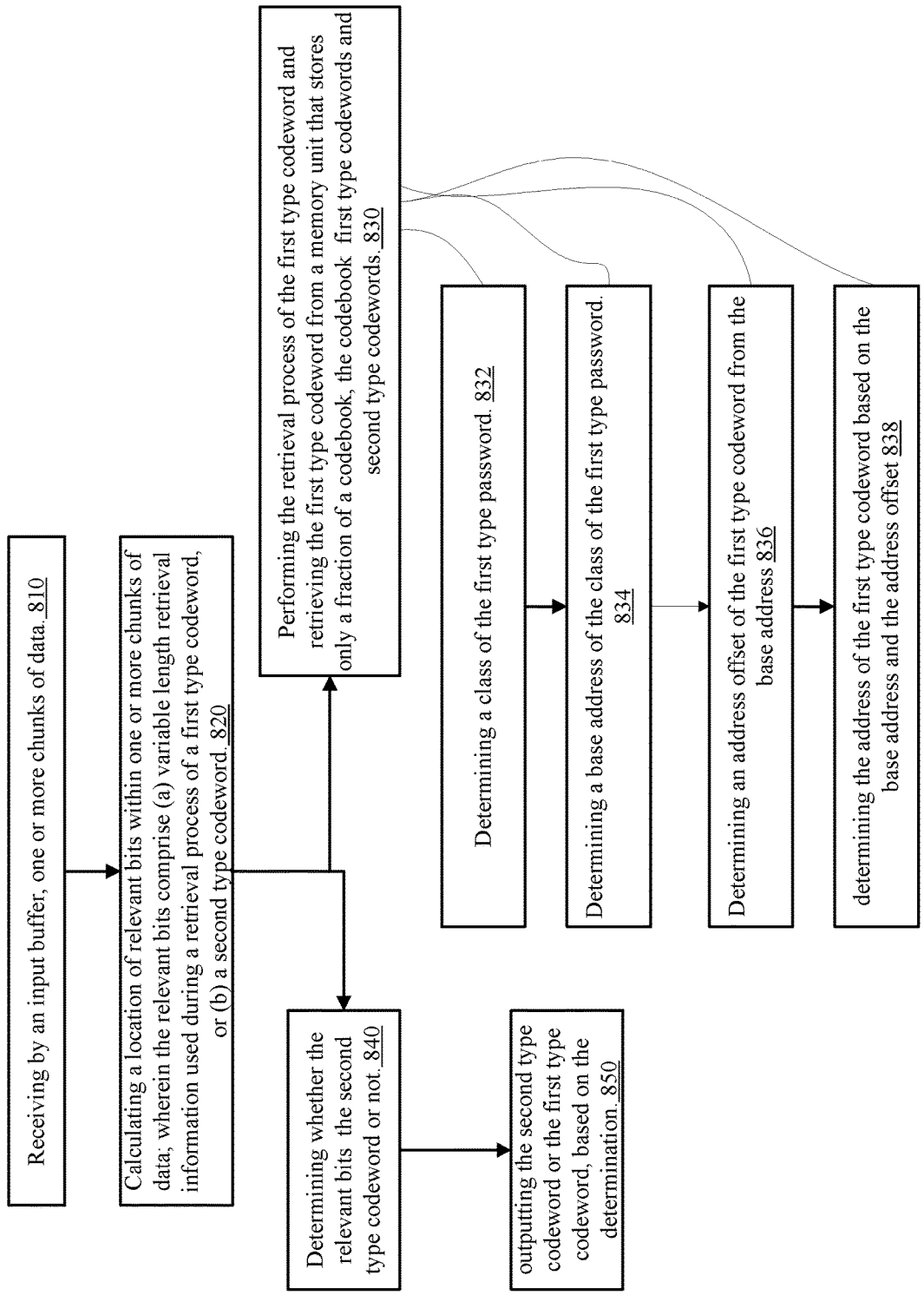
FIG. 8 illustrates a method according to an embodiment of the invention.

FIG. 8 illustrates method 800.

Method 800 may start by step 810 of receiving by an input buffer, one or more chunks of data.

Step 810 may be followed by step 820 of calculating a location of relevant bits within one or more chunks of data; wherein the relevant bits comprise (a) variable length retrieval information used during a retrieval process of a first type codeword, or (b) a second type codeword.

Step 820 may be followed by any one of steps 830 and 840.

Step 830 may include performing the retrieval process of the first type codeword and retrieving the first type codeword from a memory unit that stores only a fraction of a codebook, the codebook first type codewords and second type codewords.

Step 840 may include determining whether the relevant bits the second type codeword or not.

Step 840 may be followed by step 850 of outputting the second type codeword or the first type codeword, based on the determination.

The memory unit may map addressed to first type codewords—thus may be an address to first type codeword look up table.

In the memory unit different classes of first type codewords may be one class after the other.

Step 830 may include step 832 of determining a class of the first type password; step 834 of determining a base address of the class of the first type password; step 836 of determining an address offset of the first type codeword from the base address; and step 838 of determining the address of the first type codeword based on the base address and the address offset.

Step 832 may include retrieving a first part of the relevant bits (for example—8 bits) and finding the class by accessing a first look up table (LUT) that maps values of the first part of the relevant bits to classes of first type codewords.

The finding of the class may include outputting a class indicator from the first LUT. The finding may be followed by accessing a second LUT with the class indicator and outputting from the second LUT, a second LUT output. The second LUT output may include one or more signals such as the base address of the class (class_address), and length information indicative of a length of the variable length retrieval information (for example classcode_length and/or indexcode_length).

The second LUT output may include a selection indicator (for example—indexcode_length) that is indicative of whether the relevant bits comprise the second type codeword or not.

Step 840 may be on the length information.

Step 836 may include retrieving the address offset based on the length information.

Method 800 may be executed during one or more clock cycles. A clock period may be a period during which one codeword may be received by the input buffer.

There may be provided a method for providing codewords, the method may include receiving by an input buffer, one or more chunks of data; calculating a location of relevant bits within one or more chunks of data; wherein the relevant bits may include (a) variable length retrieval information used during a retrieval process of a first type codeword, or (b) a second type codeword; performing the retrieval process of the first type codeword and retrieving the first type codeword from a memory unit that stores only a fraction of a codebook, the codebook may include first type codewords and second type codewords; determining whether the relevant bits may include the second type codeword or not; and outputting the second type codeword or the first type codeword, based on the determination.

The memory unit may be an address to first type codeword look up table.

The method may include storing in the memory unit different classes of first type codewords, one class after the other, wherein the performing of the retrieval process of the first type password may include: determining a class of the first type password; determining a base address of the class of the first type password; determining an address offset of the first type codeword from the base address; and determining the address of the first type codeword based on the base address and the address offset.

The determining of the class of the first type address may include retrieving a first part of the relevant bits; and finding the class by accessing a first look up table (LUT) that maps values of the first part of the relevant bits to classes of first type codewords.

The finding may include outputting a class indicator from the first LUT; wherein the finding may be followed by accessing a second LUT with the class indicator and outputting from the second LUT, a second LUT output that may include the base address of the class, and length information indicative of a length of the variable length retrieval information.

The second LUT output further may include a selection indicator that may be indicative of whether the relevant bits may include the second type codeword or not.

The method may include retrieving the second type codeword based on the length information.

The method may include retrieving the address offset based on the length information.

The first type password and the second type password store information about at least a portion of at least one neural network weight.

The steps of calculating, performing, determining and outputting may be executed during a single clock cycle.

The steps of calculating, performing, determining and outputting may be executed during a two clock cycles.

There may be provided a non-transitory computer readable medium for providing codewords, the A non-transitory computer readable medium stores instructions for receiving by an input buffer, one or more chunks of data; calculating a location of relevant bits within one or more chunks of data; wherein the relevant bits may include (a) variable length retrieval information used during a retrieval process of a first type codeword, or (b) a second type codeword; performing the retrieval process of the first type codeword and retrieving the first type codeword from a memory unit that stores only a fraction of a codebook, the codebook may include first type codewords and second type codewords; determining whether the relevant bits may include the second type codeword or not; and outputting the second type codeword or the first type codeword, based on the determination.

There may be provided a device for providing codewords, the device may include an input buffers that may be configured to receive one or more chunks of data; a memory unit configured to store only a fraction of a codebook, the codebook may include first type codewords and second type codewords; one more circuits that may be configured to: calculate a location of relevant bits within one or more chunks of data; wherein the relevant bits may include (a) variable length retrieval information used during a retrieval process of a first type codeword, or (b) a second type codeword; perform the retrieval process of the first type codeword and retrieving the first type codeword from the memory unit; determine whether the relevant bits may include the second type codeword or not; and output the second type codeword or the first type codeword, based on the determination.

The at least one circuit may include at least one lookup table and wherein the memory unit stores another lookup table.

The memory unit may be an address to first type codeword look up table.

The memory unit may be configured to store different classes of first type codewords, one class after the other.

The one more circuits may be configured to perform the retrieval process of the first type password by: determining a class of the first type password; determining a base address of the class of the first type password; determining an address offset of the first type codeword from the base address; and determining the address of the first type codeword based on the base address and the address offset.

The one more circuits may be configured to perform the determining of the class of the first type address by: retrieving a first part of the relevant bits; and finding the class by accessing a first look up table (LUT) that maps values of the first part of the relevant bits to classes of first type codewords.

The one more circuits may be configured to perform the finding by outputting a class indicator from the first LUT; wherein the finding may be followed by accessing a second LUT with the class indicator and outputting from the second LUT, a second LUT output that may include the base address of the class, and length information indicative of a length of the variable length retrieval information.

The second LUT output further may include a selection indicator that may be indicative of whether the relevant bits may include the second type codeword or not.

The one more circuits may be configured to retrieve the second type codeword based on the length information.

The one more circuits may be configured to retrieve the address offset based on the length information.

The first type password and the second type password store information about at least a portion of at least one neural network weight.

The one more circuits may be configured to (i) calculate the location of relevant bits, (ii) perform the retrieval process, and (iii) determine whether the relevant bits may include the second type codeword or not during a single clock cycle.

The one more circuits may be configured to (i) calculate the location of relevant bits, (ii) perform the retrieval process, and (iii) determine whether the relevant bits may include the second type codeword or not during two clock cycles.

Examples of the one or more circuits may be illustrated above and in any one of FIGS. 1,2 6 and 7.

The terms "including", "comprising", "having", "consisting" and "consisting essentially of" are used in an interchangeable manner.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for providing codewords, the method comprises:
    receiving by an input buffer, one or more chunks of data;
    calculating a location of relevant bits within the one or more chunks of data, wherein the relevant bits comprise (a) variable length retrieval information used during a retrieval process of a first type codeword or (b) a second type codeword;
    performing the retrieval process of the first type codeword and retrieving the first type codeword from a memory unit that stores only a fraction of a codebook, the codebook comprises first type codewords and second type codewords;
    determining whether the relevant bits comprise the second type codeword or not; and
    outputting the second type codeword or the first type codeword based on the determination.

2. The method according to claim 1 wherein the memory unit is an address to first type codeword look up table.

3. The method according to claim 1 further comprising storing, in the memory unit, different classes of first type codewords, one class after the other, wherein the performing of the retrieval process of the first type codeword comprises:
    determining a class of the first type codeword;
    determining a base address of the class of the first type codeword;
    determining an address offset of the first type codeword from the base address; and
    determining the address of the first type codeword based on the base address and the address offset.

4. The method according to claim 3 wherein the determining of the class of the first type address comprises:
    retrieving a first part of the relevant bits; and
    finding the class by accessing a first look up table (LUT) that maps values of the first part of the relevant bits to classes of first type codewords.

5. The method according to claim 4 wherein the finding comprises outputting a class indicator from the first LUT and wherein the finding is followed by accessing a second LUT with the class indicator and outputting, from the second LUT, a second LUT output that comprises the base address of the class and length information indicative of a length of the variable length retrieval information.

6. The method according to claim 5 wherein the second LUT output further comprises a selection indicator that is indicative of whether the relevant bits comprise the second type codeword or not.

7. The method according to claim 5 comprising retrieving the second type codeword based on the length information.

8. The method according to claim 5 comprising retrieving the address offset based on the length information.

9. The method according to claim 1 wherein the first type codeword and the second type codeword store information about at least a portion of at least one neural network weight.

10. The method according to claim 1 wherein the steps of calculating, performing, determining and outputting are executed during a single clock cycle.

11. The method according to claim 1 wherein the steps of calculating, performing, determining and outputting are executed during two clock cycles.

12. A non-transitory computer readable medium for providing codewords, the A non-transitory computer readable medium stores instructions for:
  receiving by an input buffer, one or more chunks of data;
  calculating a location of relevant bits within the one or more chunks of data, wherein the relevant bits comprise (a) variable length retrieval information used during a retrieval process of a first type codeword or (b) a second type codeword;
  performing the retrieval process of the first type codeword and retrieving the first type codeword from a memory unit that stores only a fraction of a codebook, the codebook comprises first type codewords and second type codewords;
  determining whether the relevant bits comprises the second type codeword or not; and
  outputting the second type codeword or the first type codeword based on the determination.

13. A device for providing codewords, the device comprises:
  an input buffer configured to receive one or more chunks of data;
  a memory unit configured to store only a fraction of a codebook, the codebook comprises first type codewords and second type codewords;
  one more circuits that are configured to:
    calculate a location of relevant bits within the one or more chunks of data; wherein the relevant bits comprise (a) variable length retrieval information used during a retrieval process of a first type codeword or (b) a second type codeword;
    perform the retrieval process of the first type codeword and retrieve the first type codeword from the memory unit;
    determine whether the relevant bits comprise the second type codeword or not; and
    output the second type codeword or the first type codeword based on the determination.

14. The device according to claim 13 wherein the one or more circuit comprise at least one lookup table and wherein the memory unit stores another lookup table.

15. The device according to claim 13 wherein the memory unit is an address to first type codeword look up table.

16. The device according to claim 13 wherein the memory unit is configured to store different classes of first type codewords, one class after the other.

17. The device according to claim 16 wherein the one more circuits are configured to perform the retrieval process of the first type codeword by:
  determining a class of the first type codeword;
  determining a base address of the class of the first type codeword;
  determining an address offset of the first type codeword from the base address; and
  determining the address of the first type codeword based on the base address and the address offset.

18. The device according to claim 17 wherein the one more circuits are configured to perform the determining of the class of the first type address by:
  retrieving a first part of the relevant bits; and
  finding the class by accessing a first look up table (LUT) that maps values of the first part of the relevant bits to classes of first type codewords.

19. The device according to claim 18 wherein the one more circuits are configured to perform the finding by outputting a class indicator from the first LUT, wherein the finding is followed by accessing a second LUT with the class indicator and outputting from the second LUT, a second LUT output that comprises the base address of the class and length information indicative of a length of the variable length retrieval information.

20. The device according to claim 19 wherein the second LUT output further comprises a selection indicator that is indicative of whether the relevant bits comprise the second type codeword or not.

21. The device according to claim 19 wherein the one more circuits are configured to retrieve the second type codeword based on the length information.

22. The device according to claim 19 wherein the one more circuits are configured to retrieve the address offset based on the length information.

23. The device according to claim 13 wherein the first type codeword and the second type codeword store information about at least a portion of at least one neural network weight.

24. The device according to claim 13 wherein the one more circuits are configured to (i) calculate the location of relevant bits, (ii) perform the retrieval process, and (iii) determine whether the relevant bits comprise the second type codeword during a single clock cycle.

25. The device according to claim 13 wherein the one more circuits are configured to (i) calculate the location of relevant bits, (ii) perform the retrieval process, and (iii) determine whether the relevant bits comprise the second type codeword during two clock cycles.

* * * * *

UNITED STATES PATENT AND TRADEMARK OFFICE
CERTIFICATE OF CORRECTION

PATENT NO. : 11,831,344 B2
APPLICATION NO. : 16/747567
DATED : November 28, 2023
INVENTOR(S) : Tomer Malach and Moshe Haiut Page 1 of 1

It is certified that error appears in the above-identified patent and that said Letters Patent is hereby corrected as shown below:

In the Claims

In Column 11, Line 43, Claim 14, delete "more circuit comprise at least one lookup table and wherein" and insert -- more circuits comprise at least one lookup table and wherein --

Signed and Sealed this
Second Day of January, 2024

Katherine Kelly Vidal
*Director of the United States Patent and Trademark Office*